United States Patent
Cho et al.

(10) Patent No.: US 7,329,574 B2
(45) Date of Patent: Feb. 12, 2008

(54) METHODS OF FORMING CAPACITOR ELECTRODES USING FLUORINE AND OXYGEN

(75) Inventors: Sung-Il Cho, Seoul (KR); Jong-Kyu Kim, Seoul (KR); Byeong-Yun Nam, Gyeonggi-do (KR); Kyeong-Koo Chi, Seoul (KR); Cheol-Kyu Lee, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 189 days.

(21) Appl. No.: 11/154,152

(22) Filed: Jun. 16, 2005

(65) Prior Publication Data

US 2006/0040443 A1    Feb. 23, 2006

(30) Foreign Application Priority Data

Aug. 17, 2004    (KR) ............... 10-2004-0064650

(51) Int. Cl.
*H01L 21/8242*    (2006.01)

(52) U.S. Cl. ............. 438/253; 438/396; 438/397; 257/E21.648

(58) Field of Classification Search ........ 438/253–256, 438/393–399
See application file for complete search history.

(56) References Cited

U.S. PATENT DOCUMENTS

| 5,893,734 | A * | 4/1999 | Jeng et al. | 438/239 |
| 6,362,042 | B1 * | 3/2002 | Hosotani et al. | 438/253 |
| 6,492,222 | B1 * | 12/2002 | Xing | 438/240 |
| 7,018,892 | B2 * | 3/2006 | Shim et al. | 438/254 |
| 2003/0062564 | A1 * | 4/2003 | Kobayashi et al. | 257/306 |
| 2003/0067028 | A1 | 4/2003 | Zheng | |
| 2004/0135216 | A1 * | 7/2004 | Suzawa et al. | 257/408 |
| 2005/0037562 | A1 * | 2/2005 | Shim et al. | 438/238 |
| 2005/0064674 | A1 * | 3/2005 | Lee et al. | 438/397 |

FOREIGN PATENT DOCUMENTS

| KR | 1020040001221 A | 1/2004 |
| KR | 1020040001226 A | 1/2004 |

* cited by examiner

*Primary Examiner*—H. Jey Tsai
(74) *Attorney, Agent, or Firm*—Myers Bigel Sibley & Sajovec, P.A.

(57) ABSTRACT

A method of forming a capacitor can include etching a metal-nitride layer in an environment comprising fluorine and oxygen to form a capacitor electrode.

17 Claims, 5 Drawing Sheets

METHODS OF FORMING CAPACITOR ELECTRODES USING FLUORINE AND OXYGEN

CROSS-REFERENCE TO RELATED APPLICATION

This application claims priority of Korean Patent Application No. 2004-64650, filed on Aug. 17, 2004 in the Korean Intellectual Property Office, the disclosure of which is incorporated by reference herein in its entirety.

FIELD OF THE INVENTION

The present invention relates to capacitors and, more particularly, to methods of forming a capacitors.

BACKGROUND

It is known that DRAM devices and ferroelectric memory devices use capacitors for data storage. Typical capacitors include two electrodes and a dielectric film between the two electrodes. With the recent trend toward higher integration density of semiconductor devices, capacitors having a cylindrical lower electrode have been developed (to provide increased capacitance).

In recent years, methods of forming a lower capacitor electrode made of titanium nitride have been suggested. Since titanium nitride has a low reactivity with dielectric substance and a low resistivity, a lower capacitor electrode adopting a high-k dielectric film or ferroelectric film of a high reactivity may be made of titanium nitride.

A conventional method of forming a lower electrode of a capacitor will now be described with reference to FIG. 1. As illustrated in FIG. 1, a mold layer 2 is formed on a semiconductor substrate 1. The mold layer 2 is patterned to form a recess 3. The mold layer 2 can be silicon oxide. A titanium nitride layer 4 is conformally formed on an entire surface of the semiconductor substrate 1. A sacrificial insulation layer 5 is formed on the titanium nitride layer 4. The sacrificial insulation layer 5 can be silicon oxide.

As illustrated in FIG. 2, the sacrificial insulation layer 5 is planarized until the titanium nitride layer 4 on the mold layer 2 is exposed to form a sacrificial insulation pattern 5a in the recess 3. The exposed titanium nitride layer 4 is etched until a top surface of the mold layer 2 is exposed to form a cylindrical lower electrode 4a in the recess 3.

It is known to use Chlorine-series gases to etch titanium nitride layers. Korean Patent Application No. 2003-22361 discusses that if titanium nitride is etched using a chlorine-series gas, a high etch rate can be obtained. If chlorine of a chlorine gas is coupled with titanium of the titanium nitride layer 4, titanium chloride ($TiCl_4$) is produced. Thus, a high etch rate for the titanium nitride layer 4 is obtained due to the etch gas containing the chlorine gas.

It is known that silicon oxide has a low etch rate using the chlorine gas. For this reason, if a portion of the sacrificial insulation layer 5 remains on the exposed titanium nitride layer 4, the exposed titanium nitride layer 4 (covered by the remaining sacrificial insulation layer 5) may not be etched.

It is known that, the etch gas may further contain argon gas to reduce the above problem. That is, an ion collision energy is enhanced to etch gases containing the chlorine and argon gases to remove the sacrificial insulation layer 5 remaining on the exposed titanium nitride layer 4 and to etch the expose titanium nitride layer 4.

If the titanium nitride layer 4 is etched using the above referenced etching, a "sharp" portion 6 of the lower electrode 4a may be formed. That is, the anisotropic etching characteristic of the plasmarized chlorine and argon gases is strengthened due to the enhanced ion collision energy. Accordingly, an upper portion of a sidewall of the lower electrode 4a is etched like a spacer to form the sharp portion 6, which may result in the electric field concentrates thereat which may increase leakage current.

SUMMARY

Embodiments according to the invention can provide methods of forming capacitor electrodes using fluorine and oxygen. Pursuant to these embodiments, a method of forming a capacitor can include etching a metal-nitride layer in an environment comprising fluorine and oxygen to form a capacitor electrode.

In some embodiments according to the invention, etching further includes plasma etching the metal-nitride layer in the environment comprising a fluorine plasma. In some embodiments according to the invention, the fluorine can be $CF_4$ and/or $CHF_3$. In some embodiments according to the invention, the metal included in the metal-nitride layer is titanium, tantalum, and/or tungsten.

In some embodiments according to the invention, etching further includes plasma etching the metal-nitride layer in the environment at an applied power of less than about 600 Watts. In some embodiments according to the invention, etching further includes plasma etching the metal-nitride layer in the environment at an applied power of about 100 Watts to about 600 watts. In some embodiments according to the invention, etching further includes plasma etching the metal-nitride layer in the environment at a pressure of about 1 mTorr to about 20 mTorr. In some embodiments according to the invention, etching further includes plasma etching the metal-nitride layer in the environment at a temperature of about 200 degrees centigrade to about 500 degrees centigrade.

In some embodiments according to the invention, etching further includes providing the fluorine in a ratio to the oxygen less than about 1 to 1. In some embodiments according to the invention, the ratio is about 1:9 to about 4:6.

In some embodiments according to the invention, a method of forming a capacitor includes forming an insulation layer on a substrate. The insulation layer is patterned to form a recess therein. A metal-nitride layer is formed on the first insulation layer and in the recess. A sacrificial layer is formed on the metal-nitride layer. The sacrificial layer is planarized until the metal-nitride layer is exposed. The metal-nitride layer is plasma etched using an etch gas comprising carbon-fluorine and oxygen to form a capacitor electrode.

In some embodiments according to the invention, plasma etching further includes plasma etching the metal-nitride layer using an etch gas comprising $CF_4$ gas and oxygen gas at an environmental pressure of about 10 mTorr, an environmental temperature of about 300 degrees centigrade, at an applied power of about 300 Watts, at a rate of about 70 sccm, wherein the a ratio of $CF_4$ gas to oxygen gas provided is about 3:7.

In some embodiments according to the invention, the insulation layer includes silicon oxide, USG, and/or SOG and an etch rate of the metal-nitride is about 3 times greater than an etch rate of the silicon oxide. In some embodiments according to the invention, the metal included in the metal-nitride layer comprises titanium, tantalum, and/or tungsten.

In some embodiments according to the invention, the fluorine is $CF_4$ and/or $CHF_3$. In some embodiments according to the invention, plasma etching further includes plasma etching the metal-nitride layer in the environment at an applied power of less than about 600 Watts. In some embodiments according to the invention, plasma etching further includes plasma etching the metal-nitride layer in the environment at a pressure of about 1 mTorr to about 20 mTorr. In some embodiments according to the invention, plasma etching further includes plasma etching the metal-nitride layer in the environment at a temperature of about 200 degrees centigrade to about 500 degrees centigrade.

In some embodiments according to the invention, a method of forming a capacitor includes forming an insulation layer on a substrate. The insulation layer is patterned to form a recess therein. A metal-nitride layer is formed on the first insulation layer and in the recess. A sacrificial layer is formed on the metal-nitride layer. The sacrificial layer is planarized until the metal-nitride layer is exposed. The metal-nitride layer is plasma etched using an etch gas comprising carbon-fluorine and oxygen to recess an upper surface of the metal-nitride layer to a level below an adjacent upper surface of the sacrificial layer to form a capacitor electrode. In some embodiments according to the invention, the upper surface of the metal-nitride layer is substantially planar from a side wall of the sacrificial layer inside the electrode to a side wall of the sacrificial layer outside the electrode.

DESCRIPTION OF THE EMBODIMENTS ACCORDING TO THE INVENTION

Figure 1:
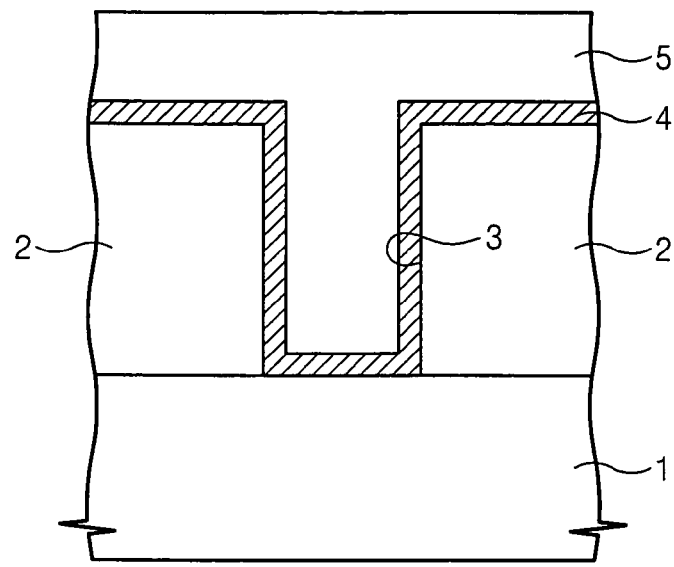
FIG. 1 and FIG. 2 are cross-sectional views illustrating a conventional method of forming a lower electrode of a capacitor.

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements. The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 3:
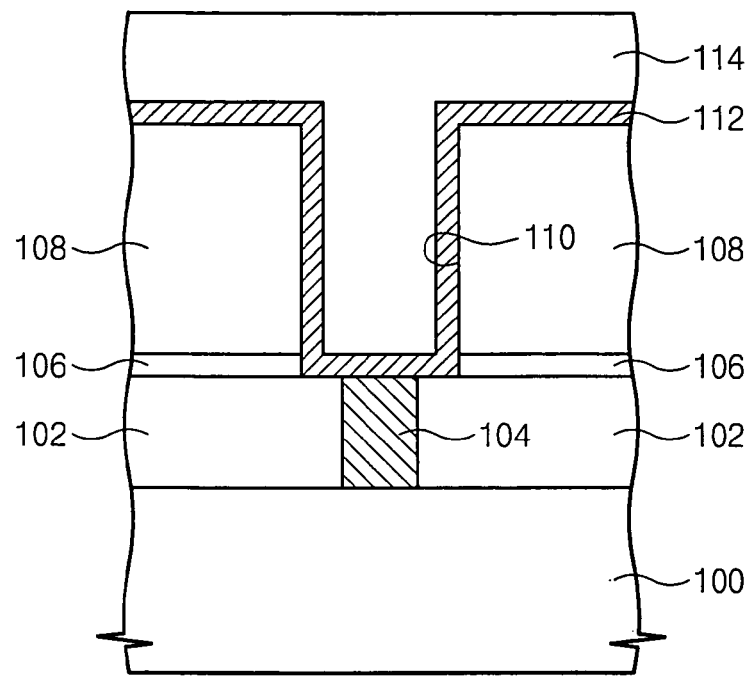
FIG. 3 through FIG. 5 are cross-sectional views illustrating methods of forming capacitors in some some embodiments according to the present invention.
Figure 4:
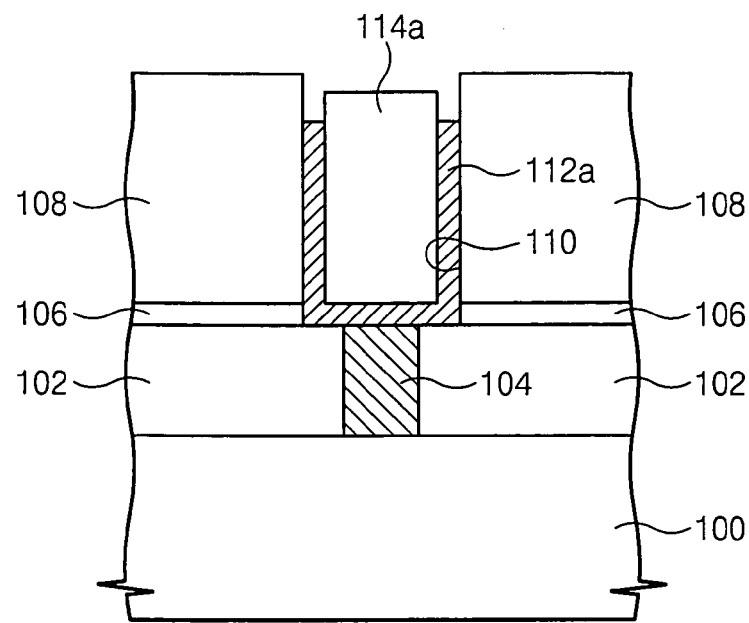
Figure 5:
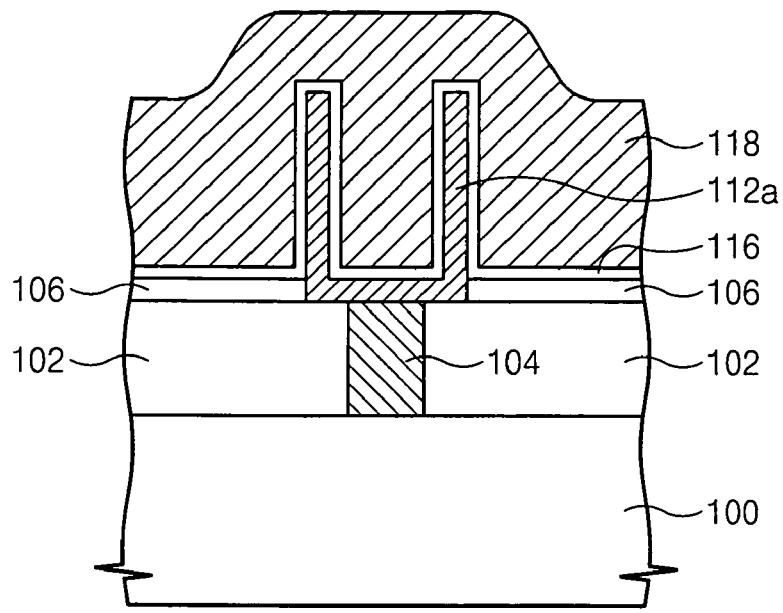
Figure 6:
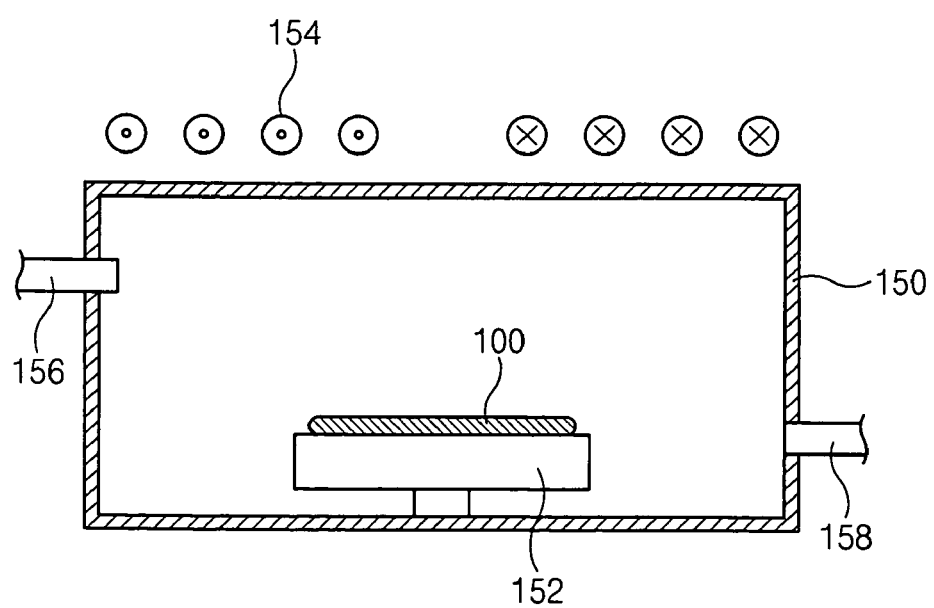
FIG. 6 illustrates a plasma etching apparatus that can be used to etch a lower electrode layer in some embodiments according to the present invention.

FIG. 3 through FIG. 5 are cross-sectional views illustrating methods of forming capacitors in some embodiments according to the invention, and FIG. 6 illustrates a plasma etching apparatus that can be used to etch a lower electrode layer in some embodiments according to the invention.

As illustrated in FIG. 3, an interlayer dielectric 102 is formed on a semiconductor substrate (hereinafter referred to as the "substrate") 100. A contact plug 104 is formed through the interlayer dielectric 102 in a predetermined area of the substrate 100. In some embodiments according to the invention, the interlayer dielectric 102 is silicon oxide, and the contact plug 104 is a conductive material such as doped polysilicon or tungsten.

An etch-stop layer 106 and a mold layer 108 are sequentially formed on the substrate 100 including on the contact plug 104. In some embodiments according to the invention, the mold layer 108 is an insulation material, such as silicon oxide. In some embodiments according to the invention, the mold layer 108 is a CVD silicon oxide such as PE-TEOS. In some embodiments according to the invention, the etch-stop layer 106 is an insulation material having an etch selectivity with respect to the mold layer 108. In some embodiments according to the invention, the etch-stop layer 106 is, for example, silicon nitride.

The mold layer 108 and the etch-stop layer 106 are successively patterned to form a capacitor recess 110 exposing a top surface of the contact plug 104. A lower electrode layer 112 is conformally formed on a surface of a substrate 100 including in the capacitor recess 110. In some embodiments according to the invention, the lower electrode layer 112 is a metal-containing substance having a low reactivity with a high-k dielectric substance or a ferroelectric substance and a lower resistivity than doped polysilicon. In some embodiments according to the invention, the lower electrode 112 is a metal-nitride, such as, titanium nitride, tantalum nitride, and/or tungsten nitride or the like.

A sacrificial insulation layer 114 is formed on the lower electrode layer 112. The sacrificial insulation layer 114 may fill the capacitor recess 110. In some embodiments according to the invention, the sacrificial insulation 114 fills a portion of the capacitor recess 110 and covers the lower electrode layer 112 in the capacitor recess 110. In some embodiments according to the invention, the sacrificial insulation layer 114 is a material having the same etch rate as the mold layer 108 or a higher etch rate than the mold layer 108. In some embodiments according to the invention, the sacrificial insulation layer 114 is the same material as the mold layer 108 and/or USG, SOG, or the like.

As illustrated in FIG. 4, the sacrificial insulation layer 114 is planarized until the lower electrode layer 112 is exposed to form a sacrificial insulation pattern 114a in the capacitor recess 110. The planarization of the sacrificial insulation layer 114 may be done using chemical mechanical polishing (CMP) or an etch-back technique.

The exposed lower electrode 112 is etched until the mold layer 108 is exposed to form a lower electrode 112a in the capacitor recess 110. The etching of the exposed lower electrode 112a is done by applying a plasma etch using an etch gas containing carbon-fluorine gas and oxygen gas. In the plasma etch process, an etch selectivity of the mold layer 108 to the lower electrode layer 112 is 3:1 or higher. In other words, in some embodiments according to the invention, the etch rate of the lower electrode layer 112 is about three times greater than the etch rate of the mode layer 108 when using the etch gas described above. In some embodiments according to the invention, the carbon-fluorine gas is $CF_4$ and/or $CHF_3$.

As shown in FIG. 4, the plasma etching is preformed to recess an upper surface of the metal-nitride layer (lower electrode 112a) to a level below an adjacent upper surface of the sacrificial layer 114a and an adjacent upper surface of the mold layer 108. Furthermore, as also shown in FIG. 4, the upper surface of the metal-nitride layer (lower electrode 112a) is substantially planar from a side wall of the sacrificial layer inside the electrode to a side wall of the sacrificial layer outside the electrode.

Figure 2:
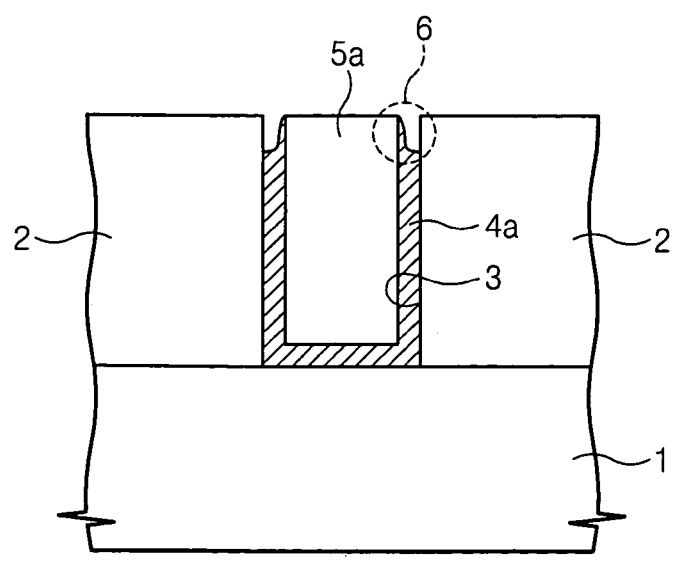

The fluorine included in the carbon-fluorine reacts with the metal included in the lower electrode layer 112 (e.g., titanium, tantalum and/or tungsten) to produce a substance that is relatively volatile. In some embodiments according to the invention, the fluorine reacts with silicon included in the sacrificial insulation layer 114 (which may remain on a surface of the exposed lower electrode layer 112) to produce silicon fluoride ($Si_xF_y$) which may be relatively volatile. That is, the fluorine may be highly chemically reactive with the metal in the lower electrode layer 112 and with the mold layer 108. Thus, the plasma etching using the etch gas may enable the ion collision energy to be reduced to less that observed in some conventional approaches. Furthermore, the carbon-fluorine gas and the oxygen gas may enhance the isotropic etching characteristics relative to conventional etch gases to reduce or prevent the formation of the type of "sharp" portion described above in reference to FIG. 2.

In the plasma etch process, the etch selectivity of the mold layer 108 relative to the lower electrode layer 112 may be about 3:1 or greater to suppress particle contaminants which may remain on the substrate 100 after formation of the lower electrode 112a.

The plasma etch process is performed using a plasma etching apparatus, which is illustrated in FIG. 6. Referring to FIG. 4 and FIG. 6, the plasma etching apparatus includes a process chamber 150 and plasma generating means 154 for generating plasma in the process chamber 150. An electrostatic chuck 152 is disposed in the process chamber 150. The substrate 100 is loaded on the electrostatic chuck 152.

At least one gas injection pipe 156 extends into the process chamber 150 through a sidewall of the process chamber 150. An etch gas containing the carbon-fluorine and oxygen gases is supplied into the process chamber through the gas injection pipe 156. An exhaust pipe 158 is disposed at one side of the process chamber 150. Post-reaction gases in the process chamber 150 may be drained through the exhaust pipe 158. The etch gases may be continuously supplied through the gas injection pipe 156, and the post-reaction gases may be continuously exhausted through the exhaust pipe 158. Thus, an internal pressure of the process chamber 150 may be constantly maintained.

The plasma etching apparatus is an inductively coupled plasma etching apparatus where the plasma generating means 154 is disposed outside the process chamber 150 to induce the formation of plasma inside the process chamber. The plasma generating means 154 may be a coil, as illustrated.

In order to control the etch selectivity of the mold layer 108 to the lower electrode layer 112 at 3:1 or higher in the plasma etch process, a plasma power of 100 to 600 watts is applied to the plasma generating means 154. That is, the plasma power is about 100 to about 600 watts to reduce the generation of fluorine radicals or fluorine ions from the carbon-fluorine gas. The mold layer 108 (made of silicon oxide) has a relatively low reactivity compared to the lower electrode layer 112 (made of metal-nitride). The plasma power is controlled to be about 600 Watts or less to further reduce the etch rate of the mold layer 108 relative to the etch rate of the lower electrode layer 112 in the plasma etch process.

As a result, the plasma power may be applied at a range of about 100 Watts to about 600 Watts to maintain the etch selectivity of the mold layer 108 to the lower electrode layer 112 at 3:1 or greater. If the plasma power is reduced to control the etch selectivity at 3:1 or greater, etch residues generated in the plasma etch process may be reduced to suppress particle contaminants on the substrate 100.

A supply ratio of the carbon-fluorine gas to the oxygen gas injected to the gas injection pipe 156 is about 1:9 to about 4:6. That is, the amount of the carbon-fluorine supplied is reduced to decrease fluorine radical substance or fluorine ion substances. Thus, the etch selectivity of the mold layer 108 to the lower electrode layer 112 may be maintained at 3:1 or greater in the plasma etch process to suppress particle residues generated in the plasma etch process.

An internal pressure of the process chamber 150 (i.e., the environment) is maintained at about 1 mTorr to about 20 mTorr. The internal pressure of the process chamber 150 is controlled at about 20 mTorr or less to suppress an etch residue gas generated in the plasma etch process. Further, the etch residue gases are quickly drained from the process chamber 150 to suppress particle contaminants on the substrate 100.

The plasma etch process is performed at a temperature of about 200 degrees Centigrade to about 500 degrees centigrade (i.e., in the environment). If the process temperature of the plasma etch process increases, a reactivity of the etch gas may be sufficiently increased although the plasma power is reduced. Further, an isotropic characteristic of the plasma etch may also be enhanced, so that a top surface of the sidewall of the lower electrode 112a is planarized to prevent or reduce the formation of a sharp portion on the lower electrode 112a.

Figure 7A:
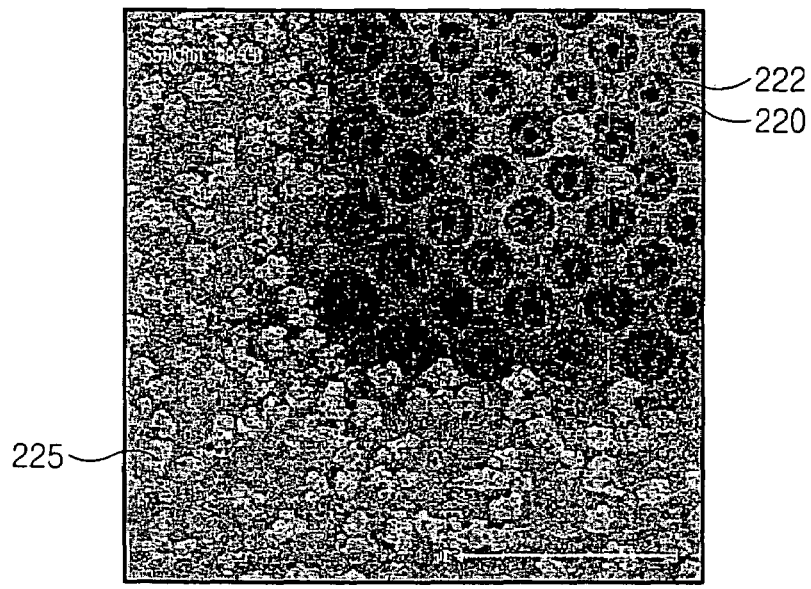
FIG. 7A and FIG. 7B are photographs of capacitors formed according to the conventional art and according to the present invention, respectively.
Figure 7B:
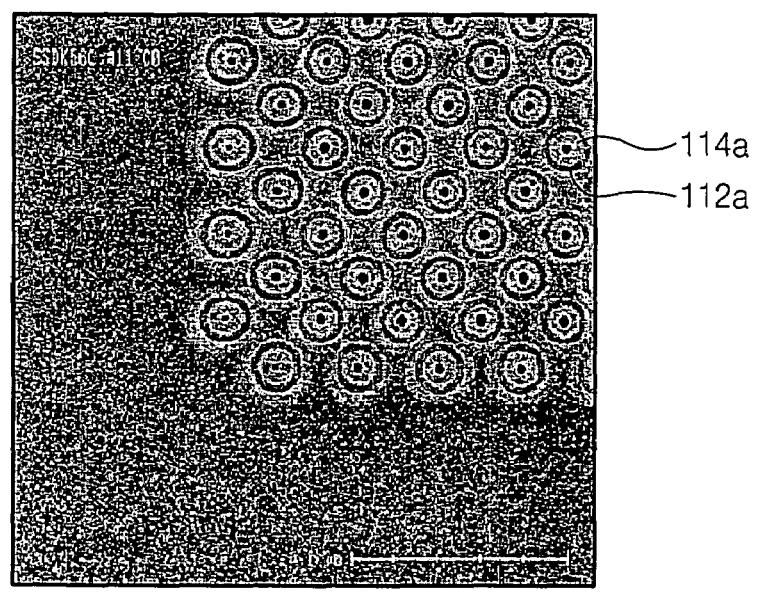
Figure 8:
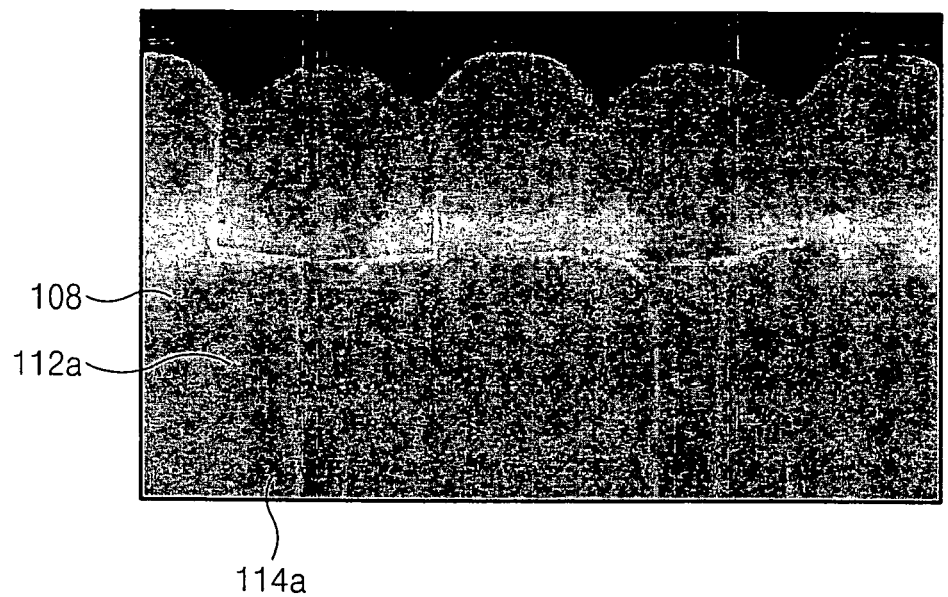
FIG. 8 is a cross-sectional photograph illustrating the cross section of lower electrodes shown in FIG. 7B.

Photographs of samples generated through tests are illustrated in FIG. 7A, FIG. 7B, and FIG. 8. Referring to FIG. 4, FIG. 7A, FIG. 7B, and FIG. 8, first and second samples are illustrated in FIG. 7A and FIG. 7B, respectively. A lower electrode layer 112 of the respective fist and second samples was made of titanium nitride, and a mold layer 108 thereof was made of PE-TEOS. Further, a sacrificial insulation layer 114 of the respective first and second samples was made of USG and filled a portion of the capacitor recess 110.

The lower electrode 112 in the first and second samples were etched using first and second plasma etching to form the lower electrode 112a, respectively. The first plasma etch process was performed according to the conventional art whereas the second plasma etching was performed using a plasma etch process according to some embodiments of the present invention.

In the first plasma etch process, an etch selectivity of the mold layer (silicon oxide layer) 108 to the lower electrode layer (titanium nitride layer) 112 is 2.25:1. In the second plasma etch process, an etch selectivity of the mold layer (silicon oxide layer) 108 to the lower electrode layer (titanium nitride layer) 112 is 4.47:1.

The condition for the first plasma etch process will now be described. $CF_4$ gas and oxygen gas was used as an etch gas. A supply ratio of the $CF_4$ gas to the oxygen gas was 3:7, and the supply amount thereof was a total of 70 sccm. Pressure in process chamber was set to 10 mTorr, and process temperature was 300 degrees centigrade. A plasma power of 1200 watts was applied. Namely, the plasma power in the first plasma etch process is greater than the plasma power according to the some embodiments of the present invention.

The condition for the second plasma etch process will now be described. A supply ratio of the $CF_4$ gas to the oxygen gas was 3:7, and the supply amount thereof was a total of 70 sccm. Pressure in the process chamber was set to 10 mTorr, and a process temperature was set to 300 degrees centigrade. Plasma power of 300 watts was applied.

As a result of the tests, particle contaminants were generated in the first sample, as illustrated in FIG. 7A. Reference numerals 220 and 222 of FIG. 7A represent a lower electrode and a sacrificial insulation pattern generated in the first plasma etch process, respectively.

In contrast, no particle contaminant was generated in the second sample, as illustrated in FIG. 7B. A top surface of a sidewall of a lower electrode 112a was planarized to remove a sharp portion, as illustrated in a cross section of FIG. 8. As shown in FIG. 8, a sacrificial insulation pattern 114a was as high as the sidewall of the lower electrode 112a. This was because prior to the second plasma etch process, a top surface of the sacrificial insulation pattern 114a became shorter than that of the mold layer 108 due to an overetch in the planarization process of the sacrificial insulation layer.

Additional tests were performed under different conditions. When the plasma power was changed to 600 watts under the condition of the second plasma etch process, particle contaminants were not generated on a substrate. On the other hand, when the plasma power applied was greater than 600 watts, particle contaminants were generated.

When the supply ratio of the $CF_4$ gas to the oxygen gas was changed to be greater than 4:6 under the conditions of the second plasma etch process, particle contaminants were generated. On the other hand, when the supply ratio of the $CF_4$ gas to the oxygen gas changed to be less than 1:9, a throughput characteristic was degraded due to a relatively low etch rate of the lower electrode 112.

Moreover, a process temperature increased gradually under the condition of the second plasma etch process. When the process temperature was set to 500 degrees centigrade or greater, the lower electrode was oxidized during its etching to degrade the characteristics of the capacitor. When the process temperature was set to 200 degrees centigrade or lower, the lower electrode 112a is etched relatively little.

As a result, the tests showed that formation of a sharp portion and generation of particle contaminants can be suppressed using plasma etch processes according to some embodiments of the invention.

Figure 9:
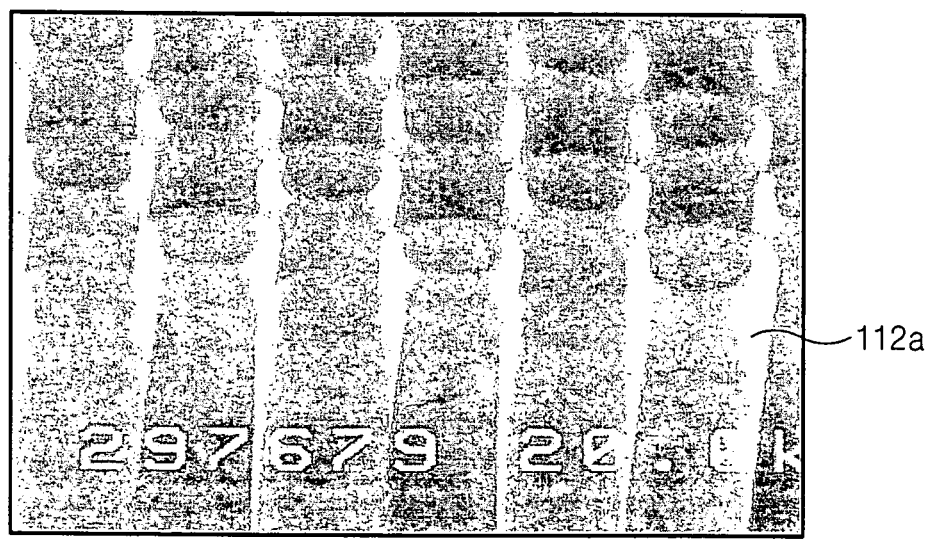
FIG. 9 is a photograph illustrating exposed lower electrodes formed according to the present invention.

Referring to FIG. 5, the sacrificial insulation pattern 114a and the mold layer 108 are removed from a substrate 100 having the lower electrode 112a to expose a surface including inner and outer sidewalls of the lower electrode 112a. Due to the etch-stop layer 106, the interlayer dielectric 102 is protected. An SEM photograph of the exposed lower electrode 112a formed in the test is illustrated n FIG. 9. The lower electrode 112a illustrated in FIG. 9 was formed using a plasma etch process performed under the same condition as the second sample of FIG. 7B. According to FIG. 9, formation of a sharp portion is suppressed at the lower electrode 112a.

Referring again to FIG. 5, a dielectric film 116 is conformally formed on an surface of the substrate 100. The dielectric film 116 may be made of a high-k dielectric substance (e.g., metallic oxide such as aluminum oxide) having a higher dielectric constant than silicon nitride or a ferroelectric substance (e.g., PZT). In some embodiments according to the invention, the dielectric film 116 may be ONO. An upper electrode 118 is formed on the dielectric film 116 to cover a surface of the lower electrode 112a. In some embodiments according to the invention, the upper electrode 118 is made of a conductive substance such as doped poly silicon or conductive metal containing substance. In some embodiments according to the invention, the conductive metal containing substance may be noble metal such as platinum or conductive metal nitride such as titanium nitride.

As described above, in some embodiments according to the invention, an exposed lower electrode layer is etched in a plasma etch process using an etch gas containing carbon-fluorine gas and oxygen gas. In plasma etching processes according to some embodiments of the invention, an etch rate of the lower electrode can be three times greater than that of a mold layer.

Although the present invention has been described with reference to the embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed:

1. A method of forming a Metal-Insulator-Metal (MIM) type capacitor comprising:
   forming an insulation layer on a substrate;
   patterning the insulation layer to form a recess therein;
   forming a metal-nitride layer on the first insulation layer and in the recess;
   forming a sacrificial layer on the metal-nitride layer;
   planarizing the sacrificial layer until the metal-nitride layer is exposed to provide a planarized sacrificial and metal-nitride layer; and
   plasma etching the metal-nitride layer included in the planarized sacrificial and metal-nitride layer using an etch gas comprising carbon-fluorine and oxygen to recess an upper surface of the metal-nitride layer to a level below an adjacent upper surface of the planarized sacrificial and metal-nitride layer to form a MIM capacitor electrode wherein etching further comprises providing the carbon-fluorine in a ratio to the oxygen less than about 1 to 1.

2. A method according to claim 1 wherein etching further comprises plasma etching the metal-nitride layer in the environment comprising a carbon-fluorine plasma.

3. A method according to claim 2 wherein the carbon-fluorine comprises $CF_4$ and/or $CHF_3$.

4. A method according to claim 2 wherein the metal included in the metal-nitride layer comprises titanium, tantalum, and/or tungsten.

5. A method according to claim 2 wherein etching further comprises plasma etching the metal-nitride layer in the environment at an applied power of less than about 600 Watts.

6. A method according to claim 1 wherein etching further comprises plasma etching the metal-nitride layer in the environment at an applied power of about 100 Watts to about 600 watts.

7. A method according to claim 2 wherein etching further comprises plasma etching the metal-nitride layer in the environment at a pressure of about 1 mTorr to about 20 mTorr.

8. A method according to claim 2 wherein etching further comprises plasma etching the metal-nitride layer in the environment at a temperature of about 200 degrees centigrade to about 500 degrees centigrade.

9. A method according to claim 1 wherein the ratio comprises about 1:9 to about 4:6.

10. A method according to claim 1 wherein plasma etching further comprises plasma etching the metal-nitride layer using an etch gas comprising $CF_4$ gas and oxygen gas at an environmental pressure of about 10 mTorr, an environmental temperature of about 300 degrees centigrade, at an applied power of about 300 Watts, at a rate of about 70 sccm, wherein the a ratio of $CF_4$ gas to oxygen gas provided is about 3:7.

11. A method according to claim 1 wherein the insulation layer comprises silicon oxide, USG, and/or SOG and an etch rate of the metal nitride layer by the plasma etching is about 3 times greater than an etch rate of the insulation layer by the plasma etching.

12. A method according to claim 1 wherein the metal included in the metal-nitride layer comprises titanium, tantalum, and/or tungsten.

13. A method according to claim 1 wherein the carbon-fluorine comprises $CF_4$ and/or $CHF_3$.

14. A method according to claim 1 wherein plasma etching further comprises plasma etching the metal-nitride layer in the environment at an applied power of less than about 600 Watts.

15. A method according to claim 1 wherein plasma etching further comprises plasma etching the metal-nitride layer in the environment at a pressure of about 1 mTorr to about 20 mTorr.

16. A method according to claim 1 wherein plasma etching further comprises plasma etching the metal-nitride layer in the environment at a temperature of about 200 degrees centigrade to about 500 degrees centigrade.

17. A method according to claim 1 wherein the upper surface of the metal-nitride layer is substantially planar from a side wall of the sacrificial layer inside the electrode to a side wall of the sacrificial layer outside the electrode.

* * * * *